United States Patent [19]
Wada et al.

[11] Patent Number: 5,808,930
[45] Date of Patent: *Sep. 15, 1998

[54] SEMICONDUCTOR MEMORY DEVICE HAVING IMPROVED WIRING ARCHITECTURE

[75] Inventors: Tomohisa Wada; Motomu Ukita; Toshihiko Hirose; Eiichi Ishikawa, all of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 676,740

[22] Filed: Jul. 8, 1996

[30] Foreign Application Priority Data

Dec. 8, 1995 [JP] Japan .................................. 7-320360

[51] Int. Cl.$^6$ ....................................................... G11C 5/06
[52] U.S. Cl. ............................................... 365/63; 365/51
[58] Field of Search .......................... 365/51, 63, 230.03, 365/72

[56] References Cited

U.S. PATENT DOCUMENTS

| | | | |
|---|---|---|---|
| 4,903,344 | 2/1990 | Inoue ......................................... | 365/51 |
| 5,264,743 | 11/1993 | Nakagome et al. ....................... | 326/56 |
| 5,280,442 | 1/1994 | Hotta et al. ............................... | 365/63 |
| 5,379,248 | 1/1995 | Wade et al. ................................ | 365/63 |
| 5,563,820 | 10/1996 | Wade et al. ................................ | 365/63 |

FOREIGN PATENT DOCUMENTS

| | | |
|---|---|---|
| 0 056 434 | 7/1982 | European Pat. Off. . |
| 0 197 639 | 10/1986 | European Pat. Off. . |
| 7-183396 | 8/1992 | Japan . |
| 4-228188 | 7/1995 | Japan . |

OTHER PUBLICATIONS

Shiomi et al., "New Bit Line Arthitecture for Ultra High Speed SRAMs," *IEEE 1991 Custom Integrated Circuits Conference*, May 12, 1991, pp. 10.4.1–10.4.4.

Shiomi et al., "A 5.8–ns 256–Kb BiCMOS TTL SRAM with T–Shaped Bit Line Architecture", *IEEE Journal of Solid-State Circuits*, vol. 28, No. 12, Dec. 1993, pp. 1362–1369.

Takahashi et al., "New Bit Line Architecture for Ultra High Speed SRAMs—T–Shaped Bit Line and its real application to 256 K BiCOMS TTL SRAMs", *Institute of Electronics, Information and Communication Engineers*, Jun. 21, 1991, pp. 117–123.

*Primary Examiner*—David C. Nelms
*Assistant Examiner*—Hoai Ho
*Attorney, Agent, or Firm*—McDermott, Will & Emery

[57] ABSTRACT

In a line configuration of each memory cell array employed in a semiconductor memory device, a pair of bit line signal input/output lines or a pair of input/output data lines for transmitting complementary signals are disposed on both sides of and adjacent the global word line so as to cancel the influence of the global word line. By these configurations, the number of shielded lines may be reduced and the width of each line and the interval between the lines are arrayed for preventing the respective lines from breaking or being short-circuited.

27 Claims, 12 Drawing Sheets

SEMICONDUCTOR MEMORY DEVICE HAVING IMPROVED WIRING ARCHITECTURE

FIELD OF THE INVENTION

The present invention relates to a semiconductor memory device, and particularly to a semiconductor memory device wherein memory cell arrays have been improved in reliability.

DESCRIPTION OF THE BACKGROUND ART

In recent years, a static random access memory (SRAM) of high-speed and mass storage capacity has been used in office automation equipment or the like. There has been a demand for higher speed and larger capacity for a SRAM.

A semiconductor memory device having a T-shaped bit line architecture has been proposed with a view toward achieving this object (see for example, Japanese Patent Application Laid-Open Publications, Nos. 4-228188 and 7-183396; Takahashi et al., "New Bit Line Architecture for Ultra High Speed SRAMs—T-Shaped Bit Line and its real application to 256K BiCMOS TTL SRAMs", *Institute of Electronics, Information and Communication Engineers*, Jun. 21, 1991, pages 117–123 Toru Shiomi, Tomohisa Wada et al., "A 5.8 ns 256 KBiCMOS TTL SRAM with T-shaped Bit Line Architecture" J. Solid State Circuits, December 1993, etc.). In the T-shaped bit line architecture, bit lines are composed of connecting lines in first and second metal layers which cross each other. Word lines and bit lines in the second metal layer are disposed in parallel. As a result, the T-shaped bit line architecture referred to above is capable of relaxing column pitch with the ratio between the number of columns in a block and the number of rows therein so as to widen the column pitch. Thus, the T-shaped bit line architecture is suitable for high integration.

FIG. 12 is a block diagram showing a structure of a memory cell array and its peripheral circuits of such a conventional semiconductor memory device of T-shaped bit line architecture. In the drawing, the semiconductor memory device includes bit line peripheral circuits 101 through 103, a row decoder 104, a plurality of memory cells MCs, a plurality of bit lines BL1 through BLn and /BL1 through /BLn, a plurality of word lines WL1 through WLm, and a plurality of bit line signal input/output lines L1 through Ln and /L1 through /Ln.

The word lines WL1 through WLm are provided so as to cross the plurality of bit lines BL1 through BLn and /BL1 through /BLn. The respective bit lines adjacent each other constitute bit line pairs. Symbols "/" indicate complementary signal lines respectively. For example, the bit lines BL1 and /BL1 constitute a bit line pair. The static memory cells MCs are respectively disposed at points where these bit line pairs and word line pairs cross each other, and configure the memory cell array.

Each of the word lines WL1 through WLm receives a signal output from the row decoder 104. The row decoder 104 decodes a row address signal supplied through an address buffer (not shown) to select one of the word lines WL1 through WLm. The bit line peripheral circuit 101 is provided at one end of each of the bit lines BL1 through BLn and /BL1 through /BLn. Further, the bit line peripheral circuit 102 is provided at the other end of each of the bit lines BL1 through BLn and /BL1 through /BLn.

Further, the bit line signal input/output lines L1 through Ln and /L1 through /Ln are respectively provided so as to cross the bit lines BL1 through BLn and /BL1 through /BLn. The bit line signal input/output lines L1 through Ln and /L1 through /Ln are electrically connected to their corresponding bit lines BL1 through BLn and /BL1 through /BLn. A predetermined signal is input to its corresponding bit line pair or a signal obtained from the corresponding bit line pair is output from the memory cell array. The bit line peripheral circuit 103 is electrically connected to the respective right side end of each of the bit line signal input/output lines L1 through Ln and /L1 through /Ln, outside the memory cell array.

In the conventional semiconductor memory device having the T-shaped bit line architecture as described above, the provision of the bit line signal input/output lines L1 through Ln and the bit lines /BL1 through /BLn makes it possible to additionally provide the bit line peripheral circuit 103 and disperse the bit line peripheral circuits in a larger area. As a result, the bit line peripheral circuits large in scale can be laid out without increasing bit line pitch. When it is desired to provide bit line peripheral circuits each having a given area, a memory cell array can be brought into a high density and thus a high density semiconductor memory device can be achieved.

FIG. 13 is a view showing structures of memory cell arrays and their peripheral circuits employed in a semiconductor memory device of the invention prior to the present invention. FIG. 14 shows in detail signal lines and power lines on a 4 row by 4 column area of each memory cell array.

Referring to FIG. 13, the semiconductor memory device includes word lines WL, bit lines BL and /BL, memory cells MCs, bit line signal input/output lines L and /L, transfer gate sections 12a and 12b, local row decoders 14a and 14b, bit line precharge circuits 16a through 16d, shift redundancy circuits 17a and 17b, and sense amplifiers and write circuits 15.

The bit line precharge circuit 16a includes NMOS transistors Q1 through Q8 and PMOS transistors Q9 and Q10. Other bit line precharge circuits 16b through 16d are constructed in the same manner. Each of the bit line precharge circuits 16a through 16d precharges a predetermined bit line pair to a source potential Vdd.

The shift redundancy circuit 17a includes resistors R1 and R2, NMOS transistors Q21 through Q23, PMOS transistors Q25 through Q28, and fuse elements F1 and F2. The shift redundancy circuit 17b also has a structure similar to that of the shift redundancy circuit 17a. The shift redundancy circuit 17a allows the fuse element F1 or F2 to blow to switch between the bit line signal input/output lines L and /L and the transfer gate section 12a, thereby relieving a defective memory.

The transfer gate section 12a includes NMOS transistors Q31 and Q32 and PMOS transistors Q33 and Q34. The transfer gate section 12b also has a structure similar to that of the transfer gate section 12a. The transfer gate section 12a outputs a data signal output from the shift redundancy circuit 17a to the corresponding sense amplifier and write circuit 15 through data input/output lines IO and /IO.

As described above, the bit line signal input/output lines L and /L are respectively electrically connected to the data input/output lines IO and /IO through the shift redundancy circuit 17a and the transfer gate section 12a. Namely, the bit line signal input/output lines and data input/output lines adjacent each other can be connected to one another at short distances by disposing the data input/output line /IO adjacent the bit line signal input/output line /L whereby electrical connections between the respective lines are facilitated.

FIG. 14 is a view showing lines on a 4 row by 4 column memory cell array employed in the semiconductor memory device shown in FIG. 13. A further detailed description will be made of the aforementioned bit lines and bit line signal input/output lines with reference to this drawing.

In the lines pattern shown in FIG. 14, 16 1-bit memory cells Mcs are arranged in 4 rows and 4 columns. Bit lines BL1, /BL1; . . . ; BL4 and /BL4 are formed on the memory cell array by a first metal layer. Bit line signal input/output lines L and /L cross the bit lines BL1, /BL1; . . . ; BL4 and /BL4 at right angles and are formed by a second metal layer. In the second metal layer, shielded lines Vdd, data input/output lines 10 and /IO and a global word line GWL are arranged parallel to the bit line signal input/output lines L and /L. The bit lines BL1, /BL1; . . . ; BL4 and /BL4 and their corresponding bit line signal input/output lines L and /L are connected to one another via through holes TH1 and TH2. In FIG. 14, for example, the bit line BL3 and the bit line signal input/output line L are electrically connected to each other via the hole TH1, whereas the bit line /BL3 and the bit line signal input/output line /L are electrically connected to each other via the through hole TH2.

A signal, whose amplitude is large, is transmitted through the global word line GWL and a signal, whose amplitude is small, is transmitted through each of the bit line signal input/output lines L and /L and the data input/output lines IO and /IO. Thus, the shielded lines Vdd each having a low impedance are inserted to prevent the respective lines from malfunctioning due to the fact that a signal whose amplitude is small is subjected to coupling noise from a signal whose amplitude is large.

In the line pattern shown in FIG. 14, the shielded lines Vdd provided on both sides of the global word line GWL serve as the shield lines Vdd each having a potential the same as the reference potential (e.g., source potential or ground potential) of the bit line precharge circuits 16a through 16d and data input/output line precharge circuit 16 shown in FIG. 13. In the semiconductor memory device shown in FIG. 13, each of the bit lines BL1, /BL1; . . . ; BL4 and /BL4 is precharged to the source potential. The bit line signal input/output lines L and /L are also precharged to the source potential in the same manner. Since the data input/output lines IO and /IO are also precharged to the source potential, the potential at each shielded line Vdd is set to the source potential. Thus, even when a failure such as a short circuit occurs between the shielded line Vdd and each of the signal lines L, /L, IO and /IO, a large amount of current can be prevented from flowing during precharge.

In the line pattern shown in FIG. 14, the potential at each shielded line Vdd adjacent the signal line such as the global word line GWL having a bearing on the selection of the memory cells is set to "H" (source potential) indicative of the non-selected state of memory cell as described above. Therefore, even when a short-circuit failure occurs between the shielded line Vdd and the global word line GWL, the memory cell can be kept in the non-selected state. Accordingly, no multiple selection is effected on the memory cell.

Thus, the four Vdd lines serve as source lines and are used as the shielded lines for reducing coupling of noise (the influence of capacitive coupling) between the signals. Of these, the Vdd lines provided on the uppermost and lowermost sides double as Vdd shielded wires used for memory cell arrays provided on their upper and lower sides. Therefore, three shielded wires Vdd, one bit line L, one bit line /L, one data input/output line IO, one data input/output line /IO and one global word line GWL, i.e., eight horizontally-extending lines are actually provided in total within a 4 row by 4 column area. Since the eight lines are provided with respect to the 4 rows, the number of lines per row needs to be two on the average.

In the memory arrays of the semiconductor memory device according to the preceding invention as described above, since the eight lines are provided with respect to the 4 rows of each memory cell array, the number of lines per row needs to be two on the average. With advances in microminiaturization, the prevention of line breaks and short-circuits and reduction of cost increase of line processing equipment remain significant problems.

SUMMARY OF THE INVENTION

The present invention has been made to solve the aforementioned problems and is intended to provide a semiconductor memory device wherein a break, a short circuit and the like in each line adjacent to high integration have been reduced.

To accomplish the foregoing and other objects, and in accordance with the purposes of the present invention, a semiconductor memory device is provided which comprises a memory array including a plurality of word lines, a plurality of first bit lines respectively provided so as to cross the plurality of word lines, and a plurality of memory cells respectively disposed at points where the plurality of word lines and the plurality of first bit lines cross each other. A plurality of second bit lines are respectively provided so as to cross the plurality of first bit lines and connected to their corresponding first bit lines, and the second bit lines have ends terminated at portions where the second bit lines are connected to the bit lines, respectively. Other lines adjacent the second bit lines are distributed so as to be bent in the directions of extensions of the second bit lines in non-extending regions of the second bit lines.

Another aspect of the invention is to provide a semiconductor memory device which comprises a memory array and each member of the array including a plurality of word lines, a plurality of first bit lines respectively provided so as to cross the plurality of word lines, and a plurality of memory cells respectively disposed at points where the plurality of word lines and the plurality of first bit lines cross respectively. A pair of second bit lines are respectively provided so as to cross the plurality of first bit lines and connected to their corresponding first bit lines, and the second bit lines have ends terminated at portions where the second bit lines are connected to the first bit lines, respectively. Second signal lines respectively cross the plurality of first bit lines and are located on the memory array so as to be adjacent the second bit lines. A first signal line is disposed on the memory array so as to cross the plurality of first bit lines. Shielded lines cross the plurality of first bit lines and are disposed on the memory array between the first signal lines and the second signal lines so as to be adjacent the first signal lines. At least the second signal lines are distributed so as to be bent in the directions of extensions of the second bit lines in non-extending regions of the second bit lines.

Another aspect of the invention is to provide a semiconductor memory device which comprises a memory array including a plurality of word lines, a plurality of first bit lines respectively disposed so as to cross the plurality of word lines, and a plurality of memory cells respectively disposed at points where the plurality of word lines and the plurality of first bit lines cross respectively. Second bit lines are respectively disposed so as to cross the plurality of first bit lines and connected to their corresponding first bit lines. A first signal line is disposed on the memory array so as to cross the plurality of the first bit lines. A pair of second signal lines for transmitting complementary signals, which crosses the plurality of first bit lines, is disposed on the memory array so as to adjoin the first signal line with the first signal line interposed therebetween. Another aspect of the invention is to provide a semiconductor memory device which comprises a memory array including a plurality of word lines, a plurality of first bit lines respectively disposed so as to cross the plurality of word lines, and a plurality of memory cells respectively disposed at points where the plurality of word lines and the plurality of first bit lines cross. Second bit lines are respectively disposed on the memory array so as to cross the plurality of first bit lines and connected to their corresponding first bit lines. A first signal line is disposed on the memory array so as to cross the plurality of first bit lines. Second signal lines are disposed on the memory array so as to cross the plurality of first bit lines, and each second signal line has a length greater than that of each second bit line. Further, each second bit line is disposed between the first signal line and each second signal line.

Another aspect of the invention is to provide a semiconductor memory device which comprises a memory array including a plurality of word lines, a plurality of first bit lines respectively disposed so as to cross the plurality of word lines, and a plurality of memory cells respectively disposed at points where the plurality of word lines and the plurality of first bit lines cross respectively. And a first signal line is disposed on the memory array so as to cross the plurality of first bit lines. Second signal lines respectively are disposed on the memory array so as to cross the plurality of first bit lines. Second bit lines cross the plurality of first bit lines and connected to their corresponding first bit lines, and each second bit line is disposed between the first signal line and the second signal line on the memory array and have an end terminated at a portion where the second bit line is connected to the corresponding first bit line. Shielded lines are respectively disposed on extensions of the second bit lines in non-extending regions of the second bit lines.

Still another aspect of the invention is to provide a semiconductor memory device which comprises a memory array including a plurality of word lines, a plurality of first bit lines respectively disposed so as to cross the plurality of word lines, and a plurality of memory cells respectively disposed at points where the plurality of word lines and the plurality of first bit lines cross respectively. A first signal line is disposed on the memory array so as to cross the plurality of first bit lines. Second bit lines cross the plurality of first bit lines and connected to their corresponding first bit lines, and each second bit line has an end terminated at a portion where the second bit line is connected to the corresponding first bit line, and is being disposed on the memory array so as to adjoin the first signal line. Shielded lines are respectively disposed on extensions of the second bit lines in non-extending regions of the second bit lines. Second signal lines respectively cross the plurality of first bit lines and are disposed on the memory array so as to adjoin the second bit lines and the shielded lines.

A further aspect of the invention is to provide a semiconductor memory device which comprises a plurality of memory arrays each including a plurality of word lines, a plurality of first bit lines respectively disposed so as to cross the plurality of word lines, and a plurality of memory cells respectively disposed at points where the plurality of word lines and the plurality of first bit lines cross respectively. Second bit lines are respectively disposed on each memory array so as to cross the plurality of first bit lines and connected to their corresponding first bit lines. First signal lines are disposed on each memory array so as to cross the plurality of first bit lines. Second signal lines are respectively disposed on each memory array so as to cross the plurality of first bit lines, and the second signal lines are longer than the second bit lines. A plurality of bit line load circuits are disposed for respectively supplying a predetermined potential to the second signal lines. And a plurality of transfer gates are disposed for respectively providing connection or disconnection between the second bit lines and the second signal lines, whereby each bit line load circuit is reduced in charging capacity upon conduction of each transfer gate and the non-selected first bit lines are maintained at the predetermined potential by the corresponding signal line load circuits.

A further aspect of the invention is to provide a semiconductor memory device which comprises a plurality of memory arrays each including a plurality of word lines, a plurality of first bit lines respectively disposed so as to cross the plurality of word lines, and a plurality of memory cells respectively disposed at points where the plurality of word lines and the plurality of first bit lines cross respectively. Second bit lines are disposed on each memory array so as to cross the plurality of first bit lines and connected to their corresponding bit lines. First signal lines are disposed on each memory array so as to cross the plurality of first bit lines. Second signal lines are respectively disposed on the memory array so as to cross the plurality of first bit lines, and each signal line is longer than each second bit line. A plurality of bit line load circuits are disposed for respectively controlling electrical connection between the first bit line pairs and a source potential. A plurality of transfer gates are disposed for respectively controlling electrical connection between the second bit line pairs and the second signal line pairs associated with the second bit line pairs. And a plurality of signal line load circuits are disposed for respectively controlling electrical connection between the second signal line pairs and the source potential. Thus, in a memory array block selected in response to a block selection signal, the bit line load circuits are brought into non-conduction and the transfer gates are brought into conduction to control the corresponding signal line load circuit between the second signal line pair, and thereby a signal is input to the selected first bit line pair and is output therefrom and the non-selected first bit line pairs are charged.

Still a further aspect of the invention is to provide a semiconductor memory device which is characterized in that the first bit lines, the second bit lines, the first signal lines and the second signal lines are respectively configured as bit lines, bit line signal input/output lines, a global word line and data input/output lines in each invention as stated above.

Other and further objects, features and advantages of the invention will appear more fully from the following description. Other and further objects, features and advantages of the invention will appear more fully from the following description.

BRIEF DESCRIPTION OF DRAWINGS

The invention will be described in detail with reference to the following drawings in which like reference numerals refer to like elements.

DETAILED DESCRIPTION OF THE PREFERRED EMBODIMENTS

Figure 1:
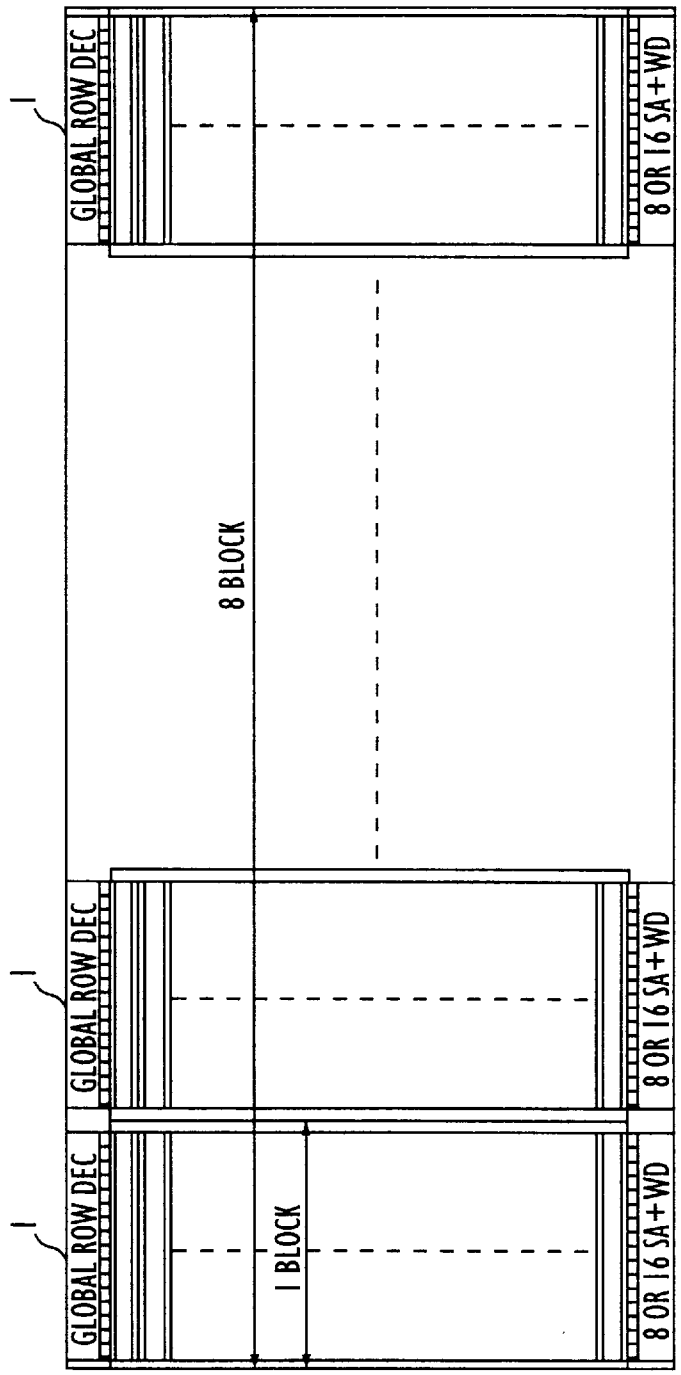
FIG. 1 is a view showing a structure of a first embodiment of a semiconductor memory device of the present invention.
Figure 2:
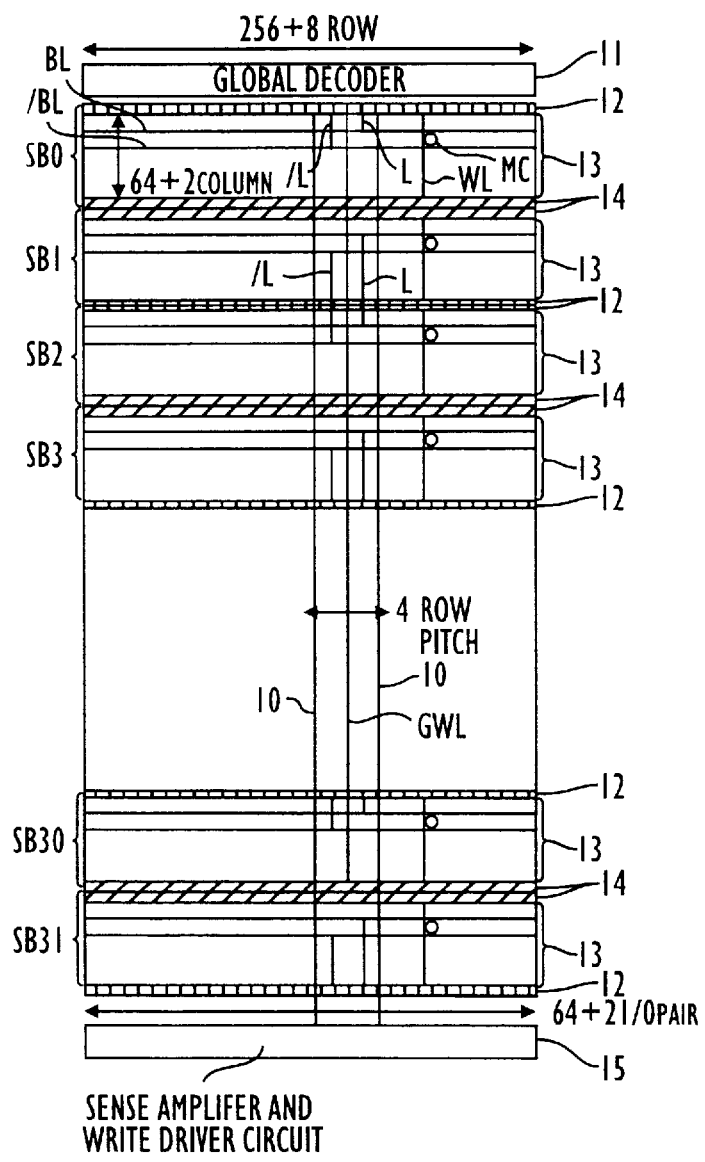
FIG. 2 is a view illustrating a structure of a memory block of the semiconductor memory device shown in FIG. 1.
Figure 3:
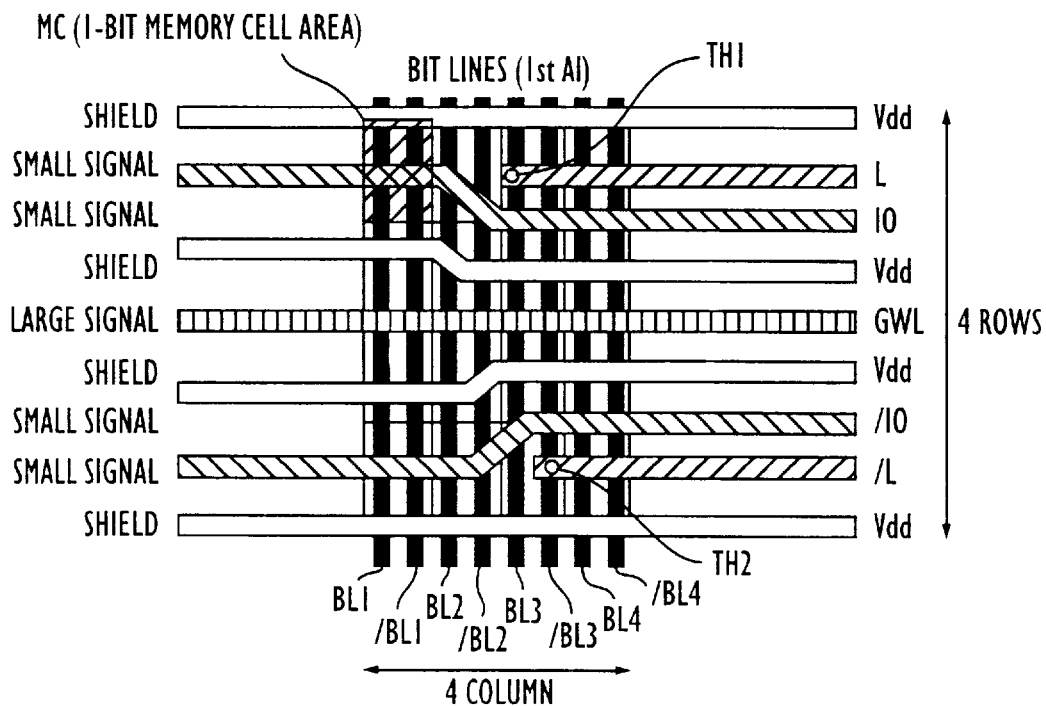
FIG. 3 is a view depicting lines in a 4 row by 4 column memory cell array of the semiconductor memory device shown in FIGS. 1 and 2.

This invention will be described in further detail by way of examples with reference to the accompanying drawings.
First Embodiment A first embodiment of the present invention will hereinafter be described with reference to the accompanying drawings. FIG. 1 is a view showing a structure of a semiconductor memory device of the present invention. FIG. 2 is a view illustrating a structure of a memory block of the semiconductor memory device. FIG. 3 is a view showing lines used for a 4 row by 4 column memory cell array of the semiconductor memory device shown in FIGS. 1 and 2.

Referring to the structural view of the semiconductor memory device shown in FIG. 1, the present semiconductor memory device includes eight memory blocks 1. Each memory block 1 has a capacity of 512 Kbits. The eight memory blocks 1 are disposed in parallel and have a capacity of 4 Mbits as a whole.

Referring next to the structural view of the memory block shown in FIG. 2, the memory block includes a global decoder 11, small blocks SB0 through SB31, and a sense amplifier and write circuit 15. The 32 small blocks SB0 through SB31 respectively include transfer gates 12, memory cell arrays 13 and local row decoders 14. Each of the small blocks SB0 through SB31 is composed of 256 plus 8 rows by 62 plus 2 columns and has a capacity of 16 kbits.

Each memory cell array 13 includes a plurality of memory cells MCs, a plurality of word lines WL, a plurality of bit lines BL and /BL which serve as first bit lines, and a plurality of bit line signal input/output lines L and /L which serve as second bit lines. The bit lines BL and /BL and the word lines WL are respectively arranged so as to cross. The memory cells MCs are provided at points where they cross, respectively. Further, the bit line signal input/output lines L and /L electrically connected to their corresponding bit lines BL and /BL are respectively arranged so as to cross the bit lines BL and /BL. Since each of the small blocks SB0 through SB31 is composed of 256 rows by 64 columns in the first embodiment, the bit line signal input/output lines L and /L are electrically connected to their corresponding bit lines BL and /BL at intervals of 256/54=4 rows. The intervals can be arbitrarily set according to the number of rows and columns.

A global word line GWL serving as a first signal line and data input/output lines IO and /IO serving as second signal lines are arranged in each of the small blocks SB0 through SB31. The global word line GWL is electrically connected to the global decoder 11 and the data input/output lines IO and /IO are electrically connected to the sense amplifier and write circuit 15.

Next, FIG. 3 illustrates the lines of the memory cell array represented in 4 rows by 4 columns. In the drawing, the memory cell array includes a plurality of memory cells MCs, bit lines BL, /BL1; . . . , BL4, /BL4 serving as first bit lines, bit line signal input/output lines L, /L serving as second bit lines, a global word line GWL serving as a first signal line, data input/output lines IO, /IO serving as second signal lines, and a ground line Vdd. In FIG. 3, the same reference numerals as those shown in FIG. 2 indicate the same elements of structure as those shown in FIG. 2.

In the line pattern of the memory cell array referred to above, the plurality of memory cells MCs are arranged in 4 rows by 4 columns. Respective bit line pairs BL1 and /BL, . . . , BL4 and /BL4 are formed by a first metal layer for each memory cell MC. The bit line signal input/output lines L and /L, the data input/output lines IO and /IO and the global word line GWL respectively cross the bit lines BL1 through /BL4 and are formed by a second metal layer. However, the bit line signal input/output lines L and /L are terminated at their corresponding through holes TH1 and TH2. The bit line signal input/output line L is electrically connected to its corresponding bit line BL3 via the through hole T1, whereas the bit line signal input/output line /L is electrically connected to its corresponding bit line /BL3 via the through hole TH2. Incidentally, the first and second metal layers have no relation between the upper and lower sides and simply mean line layers different from each other. Although the word lines WL shown in FIG. 2 are not illustrated in FIG. 3, to avoid complexity, they are provided for each memory cell MC so as to cross the bit lines BL1 through /BL4 within a layer different from that for the respective lines shown in FIG. 3. Further, the global word line GWL and the data input/output line pair IO and /IO are provided so as to extend through two or more memory array blocks.

The bit line signal input/output lines L and /L are of lines extending from the interior of the memory cell array, i.e., a portion at which the bit line signal input/output lines L and /L and the bit lines BL and /BL join together, to the end of the memory cell array as shown in FIG. 3. It is therefore possible to bend other lines, i.e., the data input/output lines IO and /IO of the region where the bit line signal input/ output lines L and /L is not extending (at non-extending portions of the bit line signal input/output lines L and /L) (in the directions in which the extrapolated bit line signal input/output lines L and /L extend) and to relax line pitch between the adjacent lines. At this time, each shielded line Vdd is also slightly bent in the direction of the extrapolated extension of each of the bit line signal input/output lines L and /L as shown in FIG. 3 in the same manner. This line construction makes it possible to increase the width of each of the data input/output lines IO and /IO or each shielded line Vdd at the non-extending portions of the-bit line signal input/output lines L and /L.

With the above construction, the width of each line and the interval between the lines can be increased in an area of about 50% of the total area of each array block, and the frequency of line breaks and short-circuits due to dust can be reduced.

Second Embodiment

Figure 4:
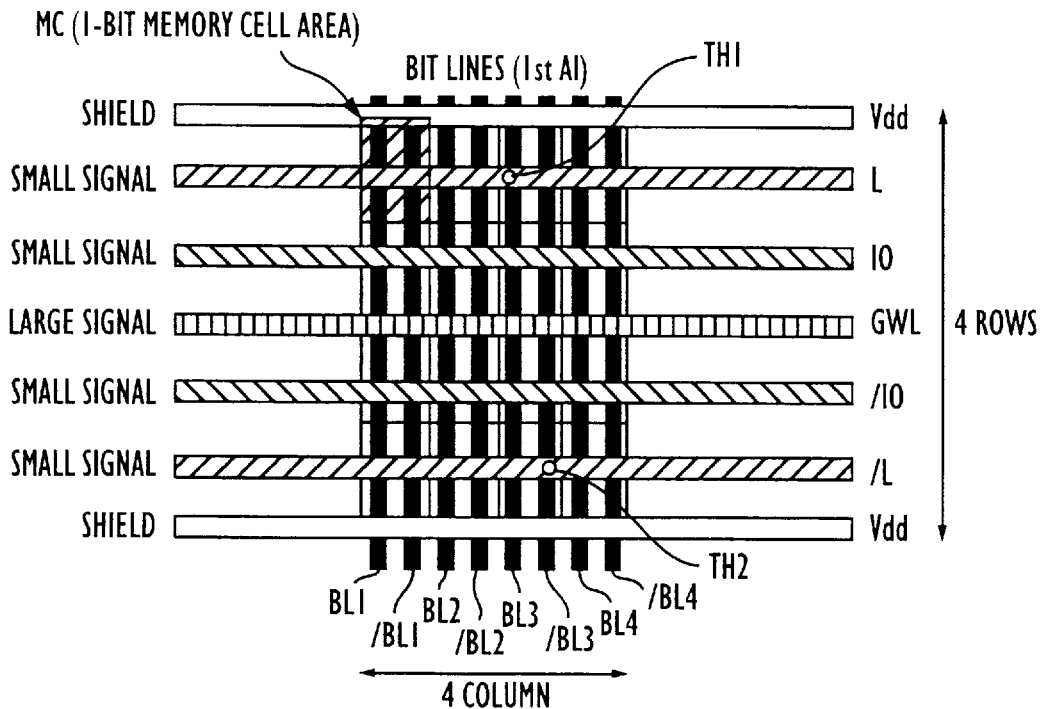
FIG. 4 is a view showing lines in a 4 row by 4 column memory cell array employed in another embodiment of the semiconductor memory device of the present invention.

A second embodiment of the present invention will be described below with the accompanying drawings. FIG. 4 shows the second embodiment illustrative of a semiconductor memory device of the present invention and is a view showing lines used for another 4 row by 4 column memory cell array of the semiconductor memory device shown in FIGS. 1 and 2.

The memory cell array includes a plurality of memory cells MCs, a plurality of bit lines BL1 and /BL1, . . . , BL4 and /BL4 each serving as a first bit line, bit line signal input/output lines L and /L each serving as a second bit line, a global word line GWL serving as a first signal line and data input/output lines IO and /IO each serving as a second signal line. Incidentally, the same reference numerals as those shown in FIG. 2 respectively indicate the same or corresponding elements of structure.

In the memory cell array shown in FIG. 4, the plurality of memory cells MCs are arranged in 4 rows by 4 columns and each of the individual bit line pairs BL1 and /BL1, . . . , BL4 and /BL4 is formed by a first metal layer for each memory cell MC. The bit line signal input/output lines L and /L, the data input/output lines IO and /IO and the global word line GWL respectively cross the bit lines BL1, /BL1, . . . , BL4, /BL4 and are made up by a second metal layer. Incidentally, the first and second metal layers have no relation between the upper and lower sides and simply means line layers different from each other. The bit line signal input/output line L is electrically connected to its corresponding bit line BL3 via a through hole TH1, whereas the bit line signal input/output line /L is electrically connected to its corresponding bit line /BL3 via a through hole TH2. Although the word lines WL shown in FIG. 2 are not illustrated in FIG. 4, to avoid complexity, they are provided for each memory cell MC so as to cross the bit line BL1 through /BL4 within a layer different from that for the respective lines shown in FIG. 4. Further, the global word line GWL and the data input/output lines IO and /IO are provided so as to extend through two or more memory array blocks.

Figure 14:
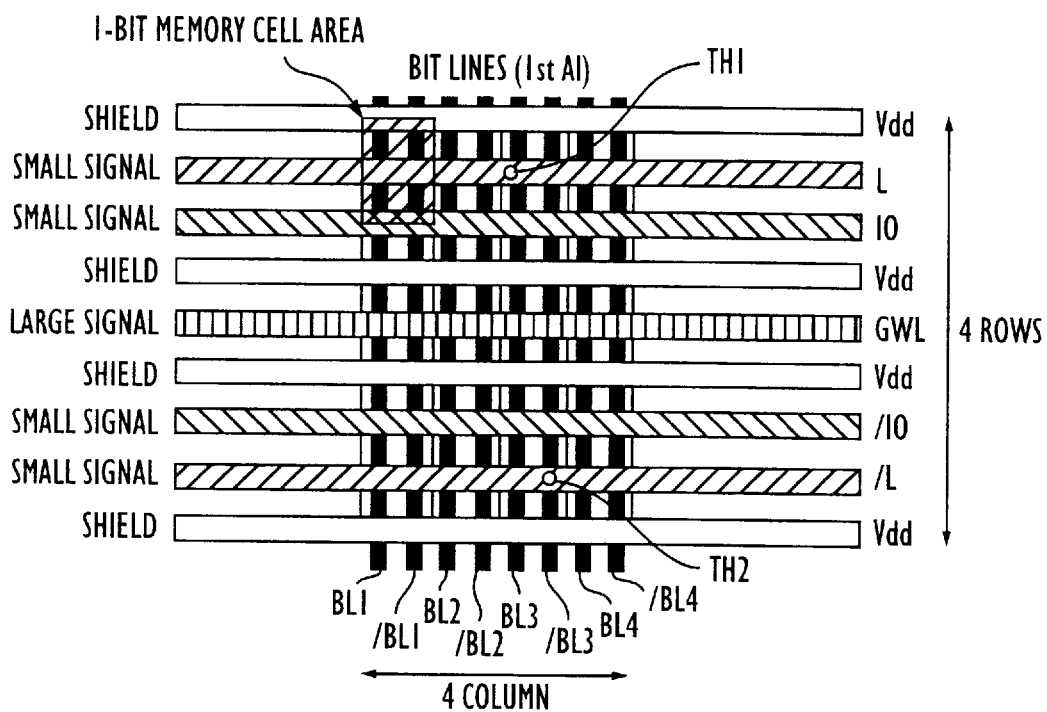
FIG. 14 is a background view showing lines of a 4 row by 4 column memory cell array employed in a semiconductor memory device.

The line pattern of the memory cell array shown in FIG. 4 is different from a line pattern according to the preceding invention shown in FIG. 14, The shielded wires Vdd on both sides of the global word line GWL that has existed in the preceding invention, have been removed from the lines pattern shown in FIG. 4. However, the lines on both sides of the global word line GWL are the data input/output lines IO and /IO, i.e., lines for transmission of complementary signals. In the second embodiment, the global word line GWL is of a line for transmission of a signal varied in amplitude between a Vdd level and a GND level. Capacitive coupling exists between the adjacent data input/output lines for the IO and /IO signals. A change in potential at the global word line GWL is transferred to the IO and /IO signals through capacitive coupling.

Since, however, the lines for the complementary signals are provided on both sides of the global word line GWL in the present construction, the change in potential due to capacitive coupling between the lines becomes the same potential with respect to each of the IO and /IO signals of the data input/output lines. The IO and /IO signals of the data input/output lines are of the complementary signals, and noise or the like produced from the global word line GWL is canceled and removed by a differential amplifier for amplifying a potential difference between the IO and /IO signals. Thus, since noise or the like does not exert an influence on the operation of the differential amplifier, the differential amplifier can be normally operated. The noise from the global word line GWL due to the capacitive coupling is so-called common mode noise.

With the above construction, the number of lines extending in the direction in which they cross the bit lines at right angles, can be reduced from eight employed in the preceding invention to six in the 4 row by 4 column area of the memory cell array. Further, the width of each line and the interval between the lines can be increased. Thus, line processing equipment can be reduced in cost and the frequency of line breaks and short-circuits due to dust or the like, can be reduced. Assuming that the width of each line and the interval between the lines remain unchanged, the semiconductor memory device can be highly integrated.

Third Embodiment

Figure 5:
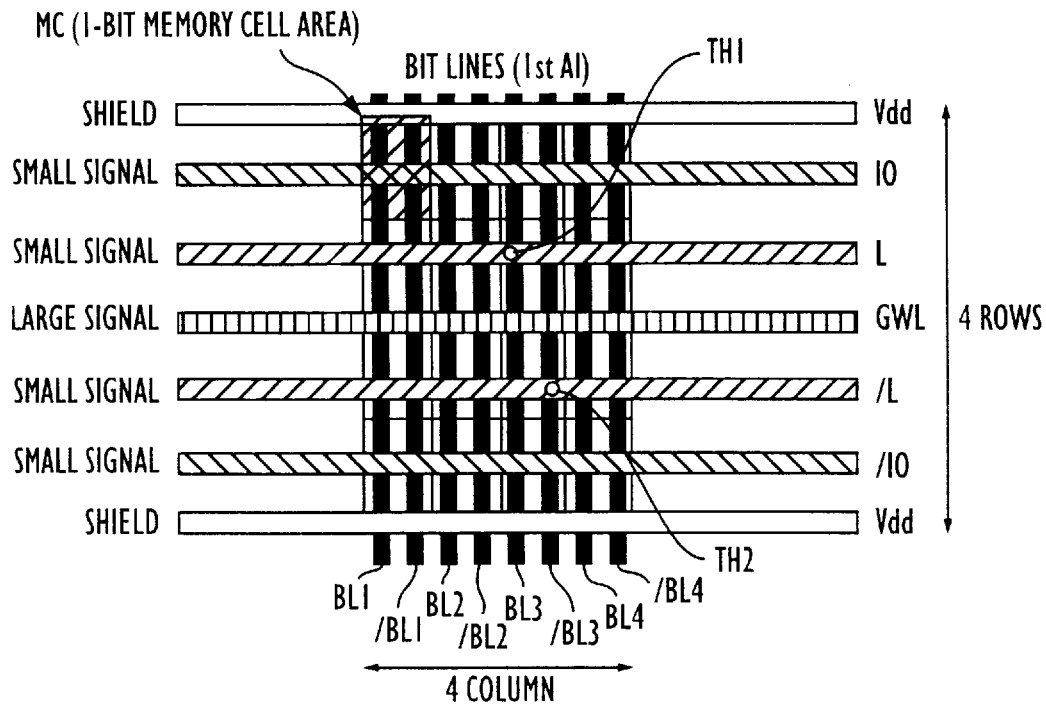
FIG. 5 is a view illustrating lines in a 4 row by 4 column memory cell array employed in a further embodiment of the semiconductor memory device of the present invention.

A third embodiment of the present invention will be described below with reference to the accompanying drawings. FIG. 5 shows the third embodiment according to a semiconductor memory device of the present invention and is a view showing lines used for a further 4 row by 4 column memory cell array of the semiconductor memory device shown in FIGS. 1 and 2. The memory cell array includes a plurality of memory cells MCs, a plurality of bit lines BL1, /BL1, . . . , BL4 and / BL4 each used as a first bit line, bit line si In the configuration of the memory cell array in FIG. 5, the bit line signal input/output L and /L are provided adjacent the global word line GWL. Next, the data input/output lines IO and /IO are respectively provided adjacent the bit line signal input/output lines L and /L. As seen in FIG. 2, the bit line signal input/output lines L and /L are terminated within each small block and are short. On the other hand, the data input/output lines IO and /IO extend beyond the small blocks and are long. The third embodiment shown in FIG. 5 is intended to provide the short bit line signal input/output lines L and /L adjacent the global world line GWL in which the amplitude of the signal is large and use them as shielded lines for the long data input/output lines IO and /IO.

Further description will be made of the reason why the memory cell array is constructed in this way, in relation to the block configuration of the semiconductor memory device shown in FIG. 2. When one small block SBO is selected from the block configurational view shown in FIG. 2, a signal input to one memory cell MC is transmitted through the bit line signal input/output lines L and/L so as to be sent to the data input/output lines IO and /IO through the transfer gate 12. The signal is amplified by its corresponding sense amplifier 15 and the amplified signal is sent to a DQ buffer (not shown in the present embodiment), followed by transmission to the outside of a chip. At this time, signals on the bit line signal input/output lines L and /L of other small blocks SB1 and the like have no bearing on the aforementioned read operation.

At this time, coupling noise produced from the global word line GWL exerts an influence on the bit line signal input/output lines L and /L at the selected block SBO. However, the influence depends on the size divided by the number of the blocks in the case of the multi-block structure (i.e. 1/number of blocks), so that the influence is lessened. In the non-selected blocks SB1 and the like at this time, the signals on the bit line signal input/output lines L and /L are charged to a predetermined potential by bit line load circuits (not shown in the present embodiment) connected to both ends of the bit lines BL and /BL. Further, each of the bit lines signal input/output lines L and /L serves as a shielded wire between the global word line GWL and the data input/output line IO or /IO. It is therefore possible to reduce the coupling noise entered in the data input/output lines IO and /IO. Further, the bit line signal input/output lines L and /L for transmitting complementary signals are disposed on both sides of the global word line GWL in the third embodiment, so that the effects of canceling the above influence can be also expected simultaneously in a manner similar to the second embodiment.

Fourth embodiment

Figure 6:
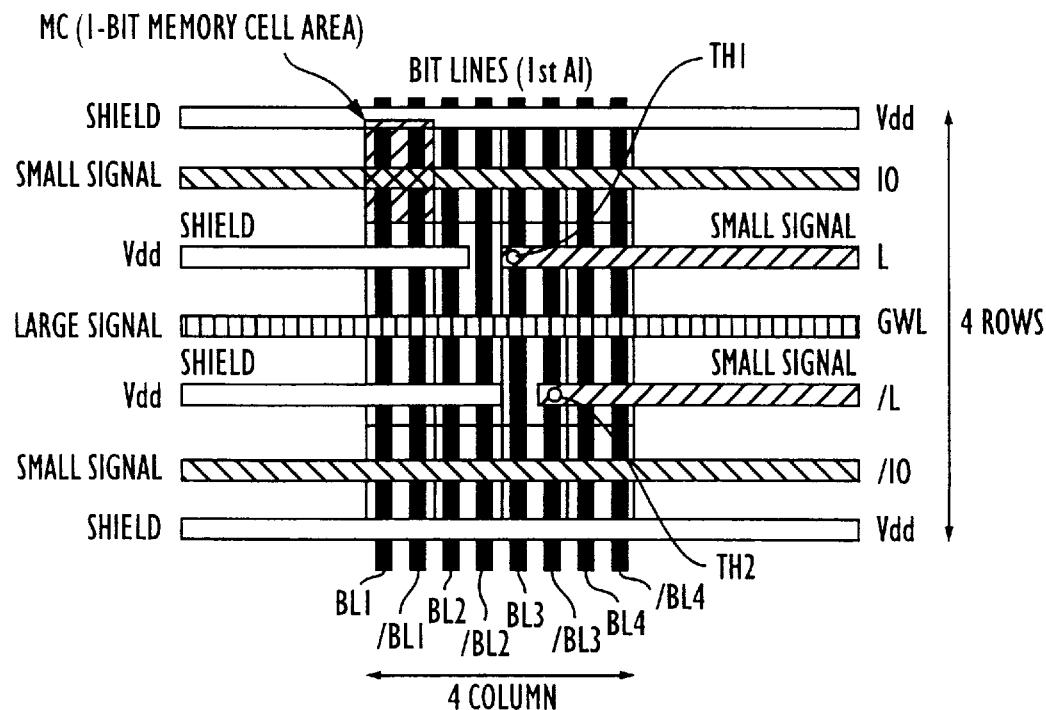
FIG. 6 is a view depicting lines in a 4 row by 4 column memory cell array employed in a still further embodiment of the semiconductor memory device of the present invention.

A fourth embodiment of the present invention will be described below with reference to the accompanying drawings. FIG. 6 shows the fourth embodiment according to a semiconductor memory device of the present invention and is a view showing lines used for a still further 4 row by 4 column memory cell array of the semiconductor memory device shown in FIGS. 1 and 2. The memory cell array includes a plurality of memory cells MCs, a plurality of bit lines BL1, /BL1, ..., BL4 and /BL4 each used as a first bit line, bit line signal input/output lines L and /L each used as a second bit line, a global word lines GWL used as a first signal line, data input/output IO and /IO each used a second signal line and shielded wires Vdd. The same reference numerals as those shown in FIG. 2 respectively indicate the same or corresponding elements of structure.

In the configurational view of the memory cell array in FIG. 6, the bit line signal input/output lines L and /L are provided adjacent the global word line GWL and the data input/output lines IO and /IO are respectively provided in the next neighborhood of the bit line signal input/output lines L and /L. Further, in the fourth embodiment, the bit line signal input/output lines L and /L are respectively electrically connected via through holes TH1 and TH2 to the bit lines BL and /BL at points where they cross the bit lines BL and /BL at right angles. The bit lines signal input/output lines L and /L are respectively terminated at the crossover points. The shielded lines Vdd are provided at non-extending regions of the bit line signal input/output lines L and /L as seen in the directions of extensions thereof. As seen in FIG. 2, the bit lines signal input/output lines L and /L are respectively terminated within each small block. Most of them are not always required to extend over the entire length of the small blocks. Shielded wires Vdd are newly provided at the area where extension of the bit lines signal input/output lines L and /L are not necessary.

In the fourth embodiment shown in FIG. 5 in the case of the third embodiment, the bit lines signal input/output lines L and /L short in length are disposed adjacent the global word line GWL in which the amplitude of a signal is large, and are used as the shielded lines for the data input/output long lines IO and /IO. Further, the shielded lines Vdd are provided at the regions of the direct extensions of the bit lines signal input/output lines L and /L and where no bit line signal input/output lines L and /L exist. Thus, the effect of shielding against the global word line GWL is increased with respect to each of the data input/output lines IO and /IO.

With the above-described construction, in the area of almost 50% of the total area of each array block, each shielded line Vdd is disposed between the global word line GWL and the data input/output line IO or /IO, and the width of each line and the interval between the lines can be increased as compared with those employed in the line pattern according to the preceding invention shown in FIG. 14. Thus, the line processing equipment can be reduced in cost and the frequency with which each line breaks or is short-circuited due to dust or the like, can be reduced.

Fifth Embodiment

Figure 7:
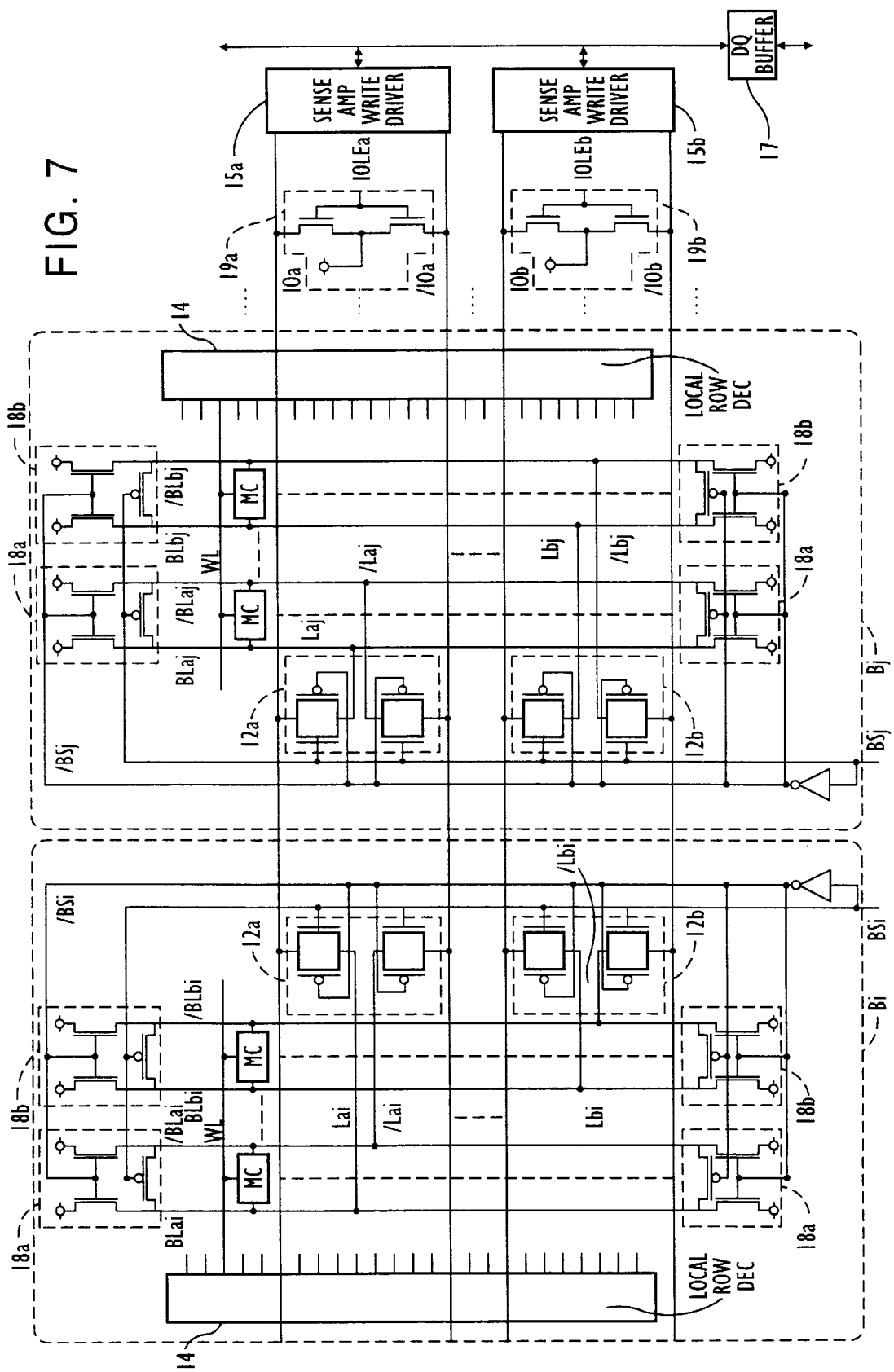
FIG. 7 is a view showing memory cell blocks and their peripheral circuits employed in a still further embodiment of the semiconductor memory device of the present invention.

A fifth embodiment of the present invention will be described below with reference to the accompanying drawings. FIG. 7 shows memory blocks and sense amplifiers and write driver circuits of the semiconductor memory device according to the fifth embodiment of the present invention. In the drawing, the semiconductor memory device includes two memory array blocks Bi and Bj, data input/output lines IOa, /IOa, ..., IOb and /IOb each serving as a second signal line, sense amplifiers and write driver circuits 15a and 15b, and DQ buffer 17, and signal line load circuits 19a and 19b. Further, the memory cell array block Bi includes memory cells MCs, word lines WL, bit lines BLai, /BLai, ..., BLbi and /BLbi each serving as a first bit line, bit line signal input/output lines Lai, /Lai, ..., Lbi and /Lbi each serving as a second bit line, and data input/output lines IOa, /IOa, ..., IOb and /IOb each serving as a second signal line. The memory cell array block Bi further includes transfer gates 12a and 12b, local row decoders 14, and bit line load circuits 18a and 18b. Although the global word line GWL serving as the first signal line shown in FIG. 2 and the like is not shown, to avoid complexity in the drawing, the global word line GWL crosses the bit lines BLai, /BLai, ..., BLbi and /BLbi at right angles and are disposed every 4 row memory cells MCs. The memory cell array block Bj is also constructed in the same manner as described above. Further, each of the semiconductor memory devices according to the first through fourth embodiments and the like may be applied as a structure of each memory cell array in the fifth embodiment.

Figure 8:
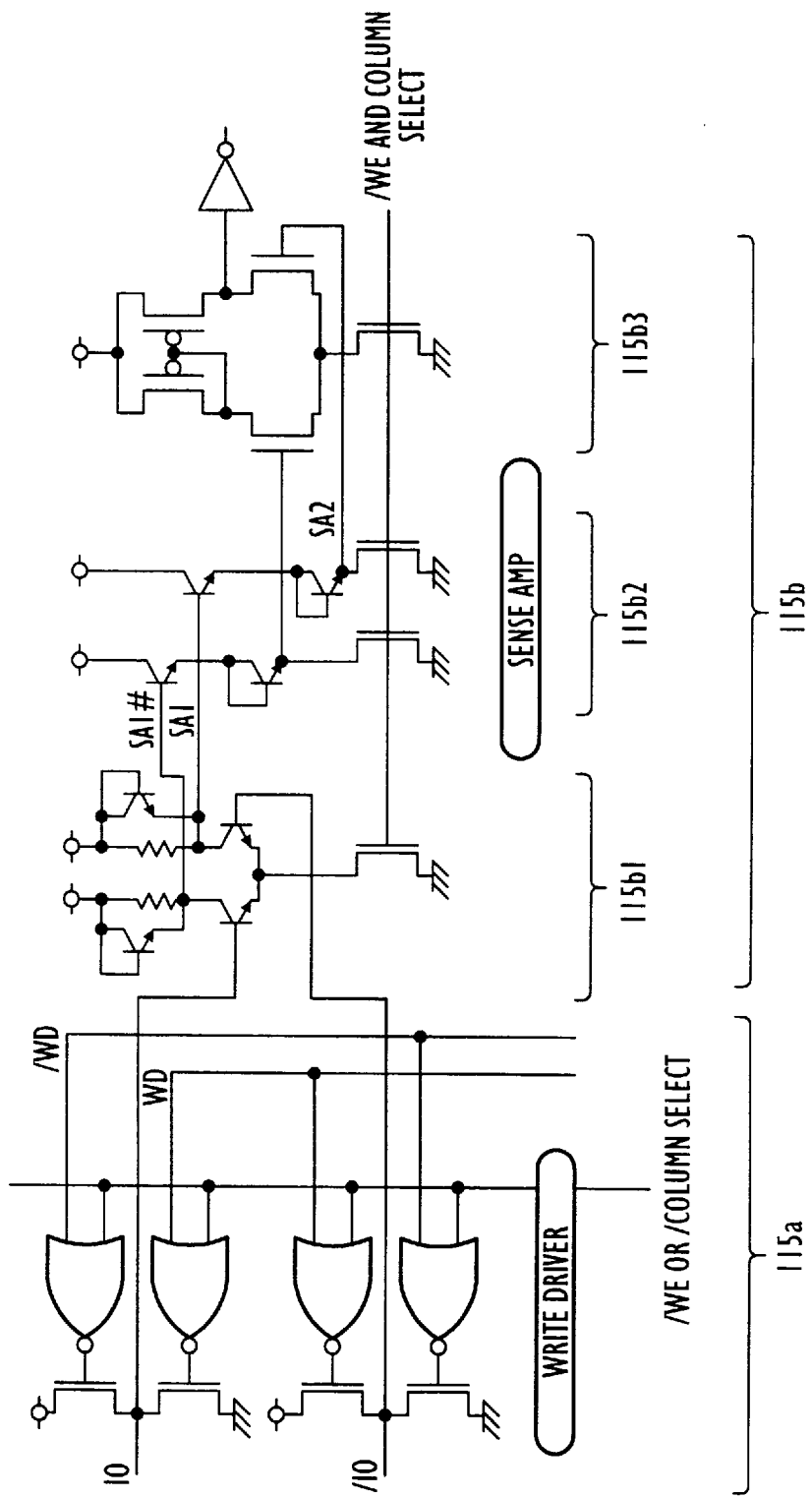
FIG. 8 is a view illustrating a sense amplifier and a write driver circuit employed in the embodiment shown in FIG. 7.

Next, FIG. 8 is a view showing the sense amplifiers and write driver circuits 15a and 15b in FIG. 7 in detail. A write driver circuit section 115a is composed of NMOS drivers. A sense amplifier section 115b is composed of an ECL type operational amplifier 115b1, a level shifting circuit 115b2 using bipolar transistors, and an operational amplifying circuit 115b3 having a current mirror load, which is composed of MOSFETs.

Figure 9:
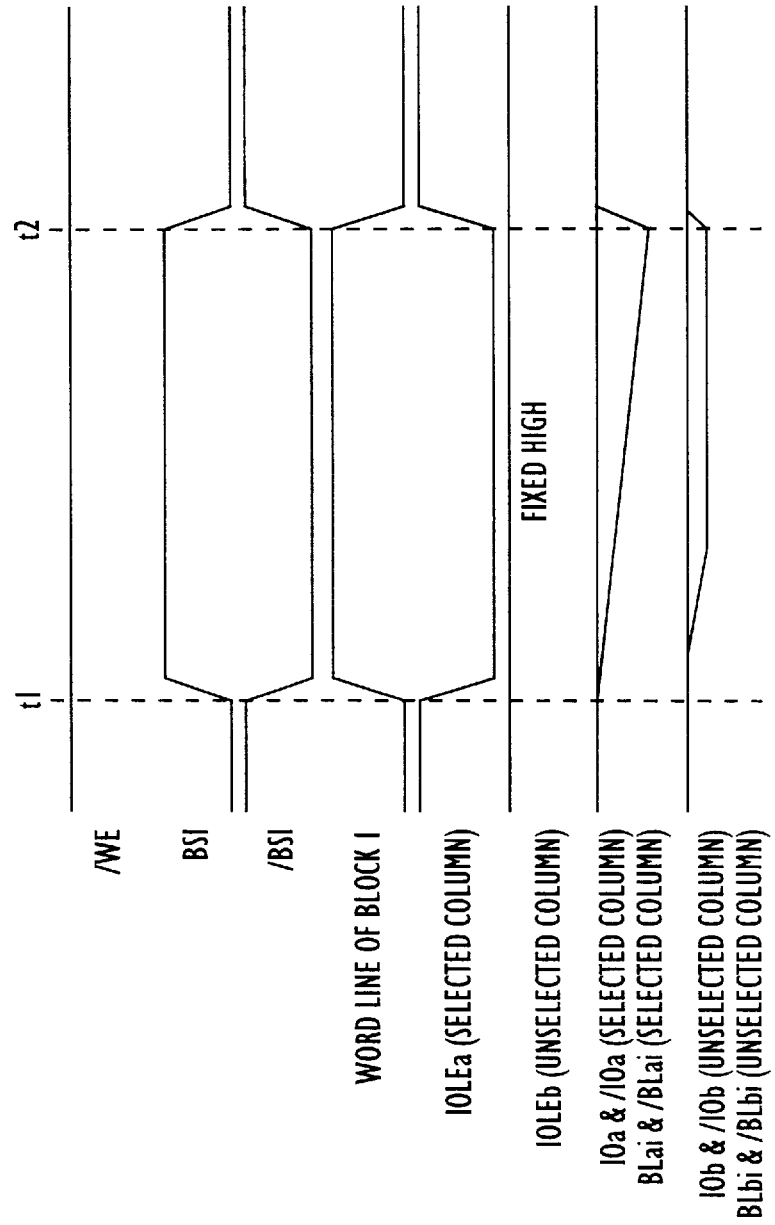
FIG. 9 is a timing waveform chart for describing a read operation of the embodiment shown in FIG. 7.

FIG. 9 is a timing waveform chart for describing a read operation of the semiconductor memory device shown in FIG. 7. Now, the read operation will be described using the timing chart shown in FIG. 9. Since the timing chart shows the read operation, a write enable signal /WE input to the sense amplifiers and write driver circuits 15a shown in FIG. 8 is fixed to an high lever (H). Thus, correspondingly, the write driver 115a and the sense amplifier 115b in FIG. 8 are respectively brought into a non-active state and an active state in a selected column, e.g., a column of the bit line pair BLai and /Blai.

Referring to FIG. 9, a block selection signal BSi for an i block is brought to a high level (H) at a time t1 so that the block Bi is selected. In response to this signal, a block selection signal /BSi is brought to a low level (L). Further, the local row decoder 14 for the block Bi is selected so as to choose a word line WL as shown in FIG. 9. At this time, the transfer gates 12a provided between the bit line signal input/output lines Lai and /Lai of the block Bi and the data input/output lines IOa and /IOa are brought into conduction. Similarly, the transfer gates 12b between the bit line signal input/output lines Lbi and /Lbi and the data input/output lines IOb and /IOb are also brought into conduction. Further, the bit lines load circuits 18a and the bit lines load circuits 18b respectively connected to both ends of the bit line pairs BLai and BLai and BLbi are brought into an off state (Off). Thus, all the bit lines BLai and /BLai and BLbi and /BLbi of the selected block Bi are disconnected from the bit line loads 18a or 18b, so that they are electrically connected to their corresponding data input/output lines IOa and /IOa or IOb and /IOb.

At this time, in a signal line load 19a for the data input/output signal line IOa and /IOa of the selected column (BLai and /BLai) where the read operation is executed, and IOLE signal (IOLEa) corresponding to an input/output data line activation signal is made low (L) so that the signal line load 19a is set to an offstate. However, in a signal line load 19b for the data input/output lines IOb and /IOb of the non-selected column (BLbi and /BLbi) where the read operation is not effected, an input/output data line activation signal, i.e., an IOLE signal (IOLEb) is kept high so that the non-selected data input/output lines IOb and /IOb and consequently the non-selected bit lines BLbi and /BLbi are set in a percharge state.

In the selected column (BLai and /BLai) on the other hand, the bit line load circuits 18a associated with the bit line pair BLai and /BLai and the signal line load 19a associated with the data input/output line pair IOa and /IOa are both in an off state (Off). Thus, the signal can be transferred from each memory cell MC to its corresponding sense amplifier 15a at a maximum speed. The sense amplifier 15a amplifies the difference between the input signals and can send the read data to the outside of the chip.

Next, the block Bi is brought into a non-selected state at a time T2. At this time, the transfer gates 12a and 12b of the block Bi are turned off and the bit line loads 18a and 18b are turned on. Accordingly, the bit line BLai, /BLai, and /BLbi are charged by the bit line loads 18a and 18b respectively. At this time, since the bit line loads 18a and 18b are off in reading time, no influence is exerted on a read rate even when the sizes of the bit line loads 18a and 18b are increased. Thus, a sufficient increase in the size (channel width) of the transistors in each bit line load is made possible and the precharge time (charging time) of each bit line is reduced, and therefore the next access start time can be sped up.

Since the potential between the bit line pair in the non-selected column (BLbi and /BLbi) is held at this time, a charging current principally flows into the selected column (BLai and /BLai). Therefore, the peak value of the charging current can be reduced and the reliability of power line can be enhanced. It is also possible to prevent noise from being produced due to a current spike.

Figure 10:
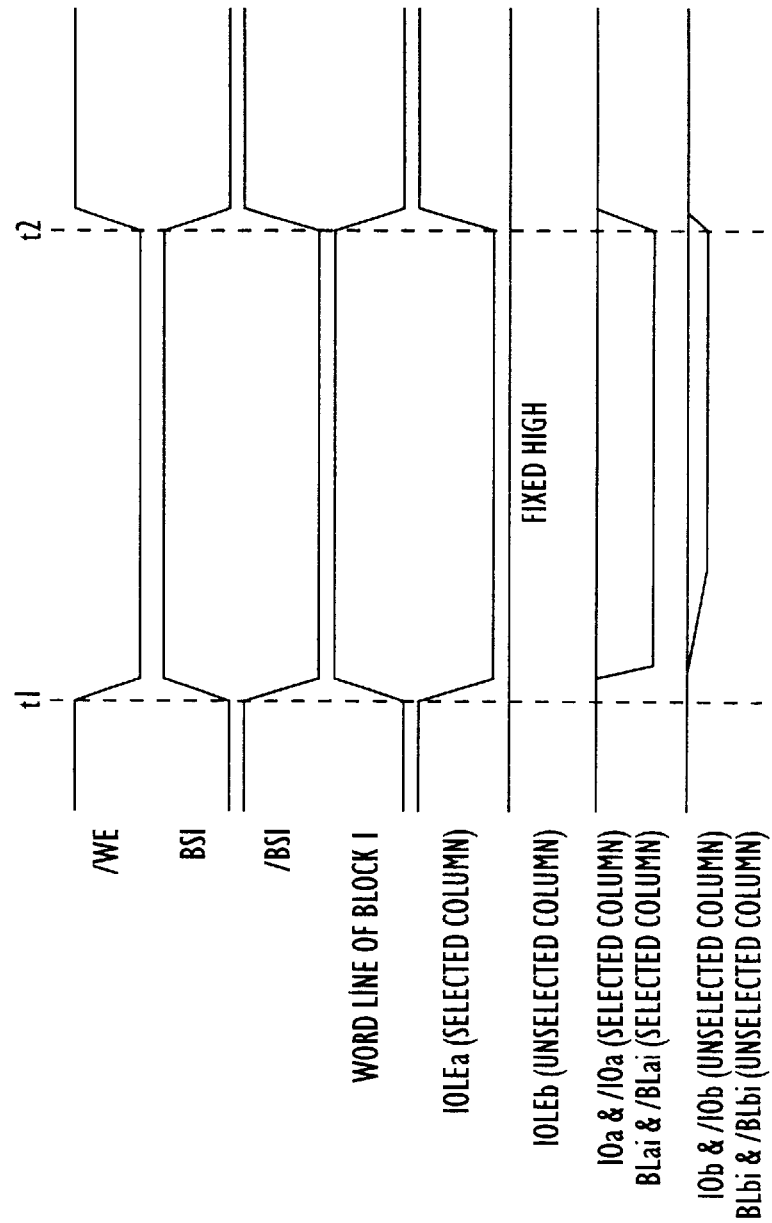
FIG. 10 is a timing waveform chart for describing a write operation of the embodiment shown in FIG. 7.

FIG. 10 is a timing waveform chart for describing a write operation of the semiconductor memory device shown in FIG. 7. The write operation will be described with reference to this timing waveform chart. FIG. 10 is much different from FIG. 9 in that a /WE signal corresponding to a write enable signal is rendered low (L) between times t1 and t2. During the low period, the write circuit 15a shown in FIG. 8 drive the data input/output lines IOa and /IOa and IOb and IOb in response to write data (WE and /WE).

The operation of the non-selected column (BLbi and /BLbi) at writing operation is the same as that of a reading operation. Only the operation of the bit line pair BLai and /BLai of the selected column (BLai and /BLai) at writing is different from that of reading. In the selected column (BLai and /BLai), the bit line load circuits 18a connected to the bit lines BLa and /BLai and is the signal line load 19a connected to the data input/output lines IOa and /IOa are in an off state and driven to predetermined potential levels by the corresponding write driver 15a. Since both loads 18a and 19a are off, no direct current flows through the write driver 15a and load elements, whereby current consumption at writing operation can be reduced.

When the block is brought into a non-selected state at the time t2, the bit lines BLai and /BLai and the input/output data lines IOa and /IOa are changed in the same manner as at reading operation.

As described above, the semiconductor memory device according to the fifth embodiment is characterized in that when the transfer gate 12a is brought into conduction, each bit line load circuit 18a is reduced in charging capacity and the non-selected first bit line BL is kept at the predetermined potential by the signal line load circuit 19a. In other words, each bit line load circuit 18a is brought into non-conduction upon conduction of the transfer gate 12a and the conducted signal line load circuit 19a holds the first bit line at the predetermined potential.

In the conventional semiconductor memory device, the bit line loads 18a and 18b are not turned off at reading and writing operation. In the fifth embodiment, however, the bit line loads 18a and 18b are disconnected as described above. The above construction makes it possible to achieve the merits of (a) a faster read speed, (b) a reduction in current at reading operation, (c) an improvement in precharge rate after completion of reading/writing, (d) a decrease in peak value of the current at precharge, etc.

Sixth Embodiment

Figure 11:
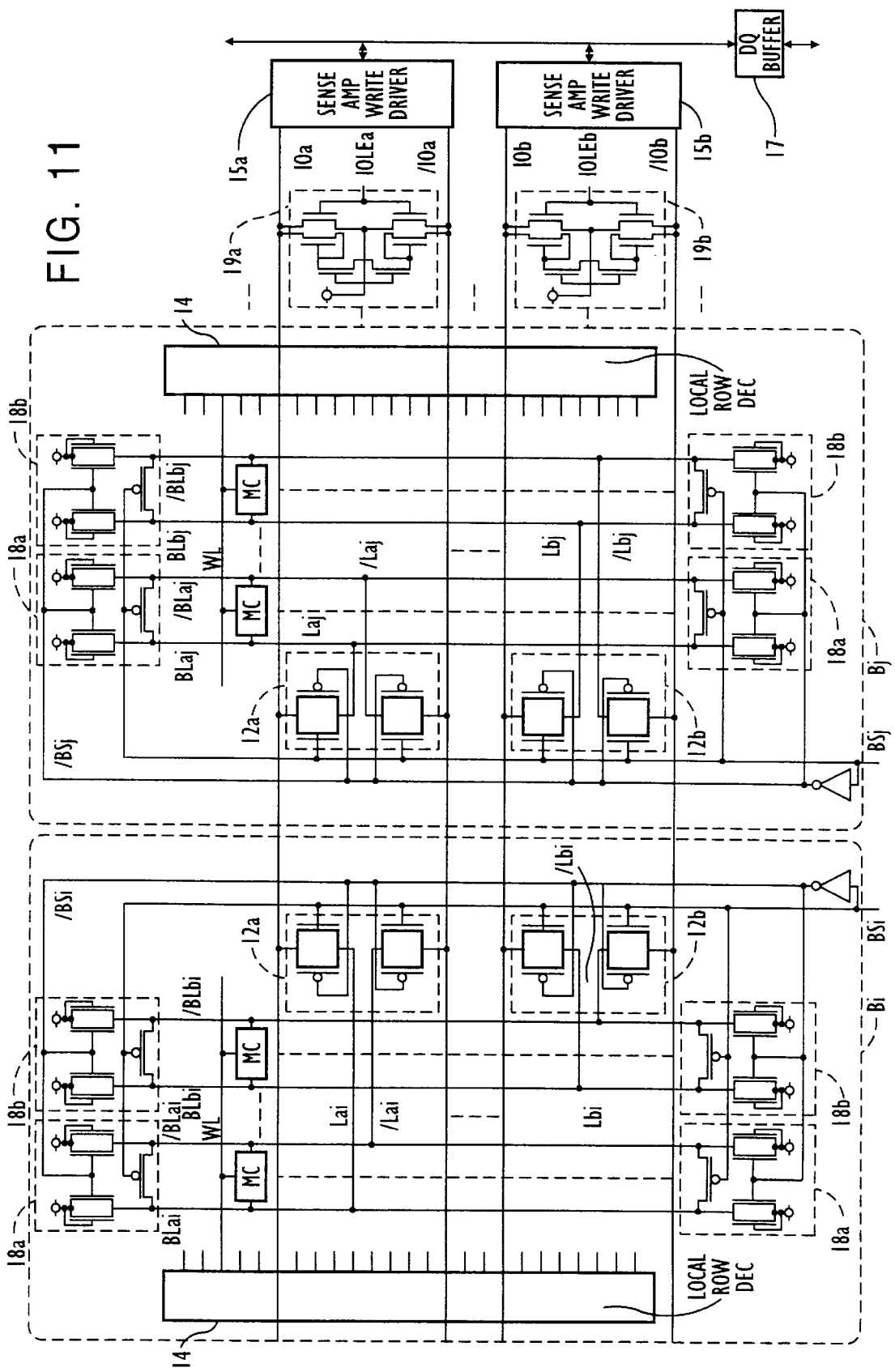
FIG. 11 is a view showing memory cell blocks and their peripheral circuits employed in a still further embodiment of the semiconductor memory device of the present invention.
Figure 12:
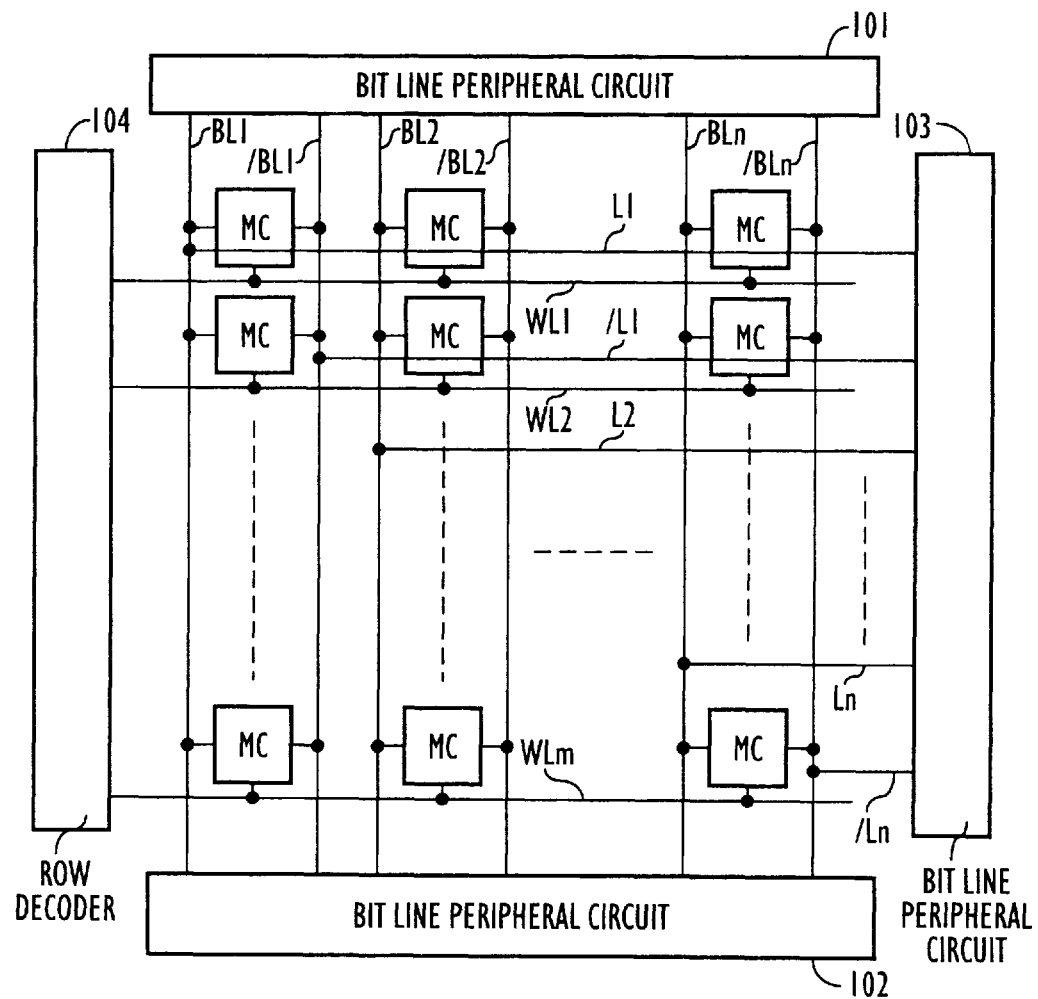
FIG. 12 is a view illustrating a structure of a semiconductor memory device having a conventional T type bit line architecture.
Figure 13:
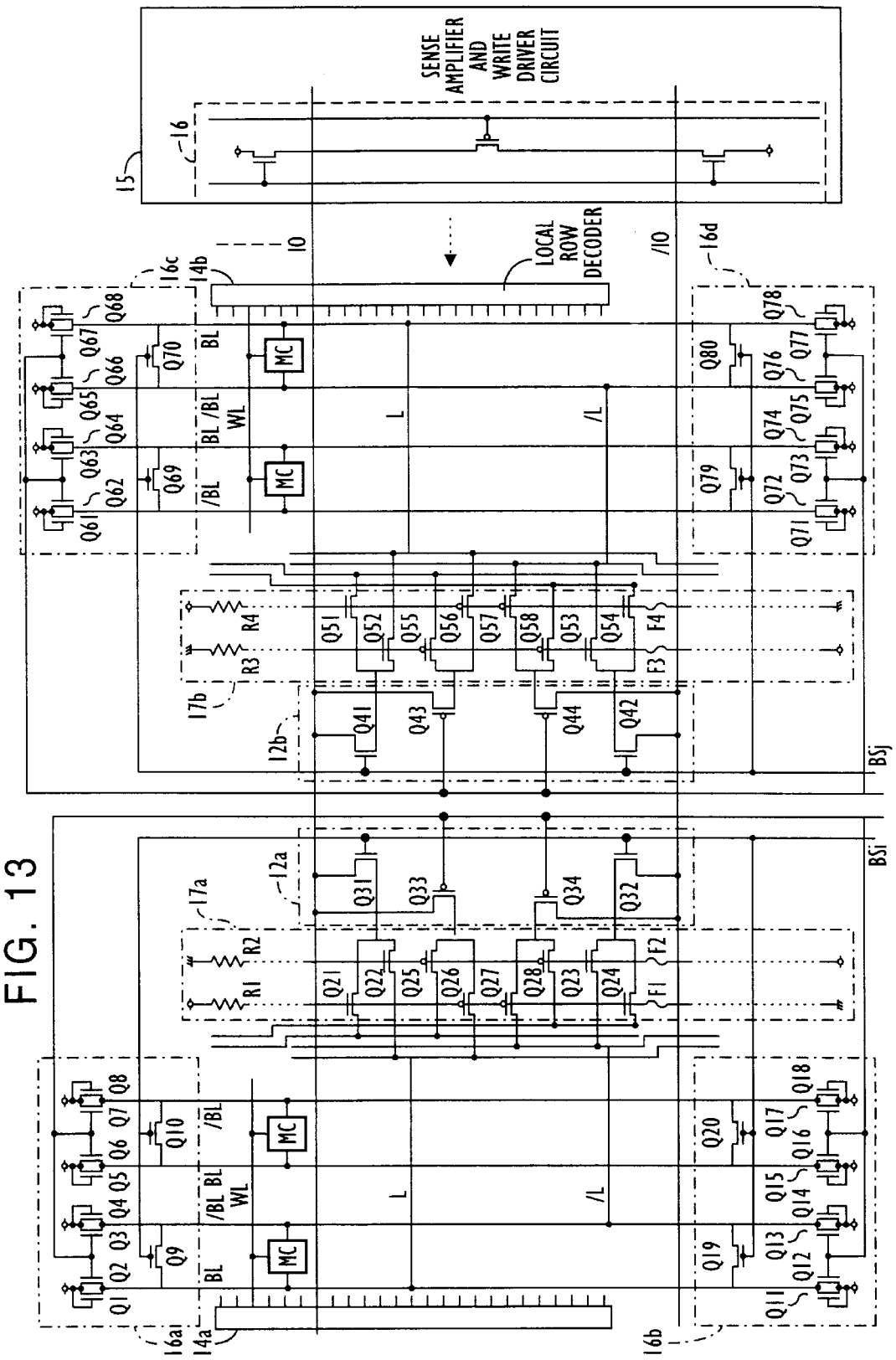
FIG. 13 is a background view depicting memory cell blocks and their peripheral circuits.

A sixth embodiment of the present invention will be described below with reference to the accompanying drawing. FIG. 11 illustrates other forms of the memory blocks and the sense amplifiers and write driver circuits all employed in the semiconductor memory device of the present invention. The reference numerals in the drawing respectively indicate the same or corresponding elements of structure as those shown in FIG. 7 and their detailed description will therefore be omitted.

The sixth embodiment shows modifications of the memory blocks and the sense amplifiers and write driver circuits shown in FIG. 7. A description will be made of points different from those shown in FIG. 7. That is, the bit line load circuits 18a and 18b are respectively additionally provided with two NMOS transistors. Each NMOS transistor is reduced in size (channel length) and turned on at all times even when other load transistors are turned off in response to a change in block selection signal BS, and serve not to be brought into a complete floating state.

As another different point, signal line loads 19a and 19b connected to input/output data lines IOa, /IOa, IOb and /IOb are different in construction from those in FIG. 7, and works to restrict the potentials of low levels (L) applied to the input/output data lines IOa, /IOa, IOb and /IOb at reading operation. In the present embodiment, the potential is restricted under Vdd (source potential)—2Vthn with the threshold voltage of each MOSFET transistor as Vthn.

With the above arrangement of load elements, each of the potentials at the bit lines (BLa and /BLai) and the input/output data lines (IOa and /IOa) in the selected column at reading and writing operation can be set closer to the original charging level. It is also possible to improve a precharge rate and decrease the peak value of a precharge current.

According to the present invention, as has been described above, the semiconductor memory device of T-shaped bit line architecture is improved so as to reduce the cost of line processing equipment and decrease the frequency with which the line breaks or is short-circuited due to dust or the like. Further, by controlling the on/off of each signal line load at reading/writing operation, it is possible to achieve faster read speed, reduce current at writing operation, improve precharge rate after completion of the reading/ writing operation and reduce the peak value of current at precharge, for example.

Obviously many modifications and variations of the present invention are possible in the light of the above teachings. It is therefore to be understood that within the scope of the appended claims the invention may be practiced otherwise than as specifically described.

What is claimed is:

1. A semiconductor memory device comprising:
    a memory array including,
    a plurality of word lines;
    a plurality of first bit lines respectively disposed so as to cross said plurality of word lines;
    a plurality of memory cells respectively disposed at points where said plurality of word lines and said plurality of first bit lines cross respectively;
    a plurality of second bit lines respectively disposed generally normal to, and to cross said plurality of first bit lines and directly connected to corresponding first bit lines, said second bit lines having ends terminated at portions where said second bit lines are connected to said first bit lines, respectively; and
    other lines adjacent to said second bit lines being respectively distributed so as to be bent in directions of extensions of said second bit lines in non-extending regions of said second bit lines.

2. The semiconductor memory device according to claim 1, wherein said plurality of first bit lines are configured as bit line pairs, said plurality of second bit lines are configured as bit line signal input/output lines, and said other lines include a global word line and data input/output lines.

3. A semiconductor memory device comprising:
    a memory array including
    a plurality of word lines;
    a plurality of first bit lines respectively disposed so as to cross said plurality of word lines;
    a plurality of memory cells respectively disposed at points where said plurality of word lines and said plurality of first bit lines cross respectively;
    a pair of second bit lines respectively disposed generally normal to, and to cross said plurality of first bit lines and connected to corresponding first bit lines, said second bit lines having ends terminated at portions where said second bit lines are connected to said corresponding first bit lines, respectively;
    a first signal line disposed on said memory array so as to cross said plurality of first bit lines;
    second signal lines respectively crossing said plurality of first bit lines and disposed on said memory array so as to be adjacent second bit lines; and
    shield lines crossing said plurality of first bit lines and each being disposed on said memory array between said first signal line and a respective one of said second signal lines so as to adjoin said first signal line; and
    proximate the terminated ends of the second bit lines, said second signal lines being distributed so as to be bent in the directions of extensions of said second bit lines in non-extending regions of said second bit lines.

4. The semiconductor memory device according to claim 3, wherein said plurality of first bit lines are configured as bit line pairs, said pair of second bit lines, said first signal line and said second signal lines are respectively configured as bit line signal input/output lines, a global word line and data input/output lines.

5. A semiconductor memory device comprising:
    a memory array including,
    a plurality of word lines;
    a plurality of first bit lines respectively disposed so as to cross said plurality of word lines;
    a plurality of memory cells respectively disposed at points where said plurality of word lines and said plurality of first bit lines cross respectively;
    second bit lines respectively disposed generally normal to, and to cross said plurality of first bit lines and directly connected to corresponding first bit lines;
    a first signal line disposed on said memory array so as to cross said plurality of first bit lines; and
    a pair of second signal lines for transmitting complementary signals, said second signal lines respectively crossing said plurality of first bit lines and disposed on said memory array so as to adjoin said first signal line with said first signal line interposed therebetween.

6. The semiconductor memory device according to claim 5, wherein said plurality of first bit lines are configured as bit line pairs, said second bit lines, said first signal line and said pair of second signal lines are respectively configured as bit line signal input/output lines, a global word line and data input/output lines.

7. A semiconductor memory device comprising:
    a memory array including,
    a plurality of word lines;
    a plurality of first bit lines respectively disposed so as to cross said plurality of word lines;
    a plurality of memory cells respectively disposed at points where said plurality of word lines and said plurality of first bit lines cross respectively;
    second bit lines respectively disposed on said memory array generally normal to, and to cross said plurality of first bit lines and directly connected to corresponding first bit lines;
    a first signal line disposed on said memory array so as to cross said plurality of first bit lines; and
    second signal lines disposed on said memory array so as to cross said plurality of first bit lines, each second signal line having a length greater than that of each second bit line; and
    said each second bit line being disposed adjacent to said first signal line, and between said first signal line and said each second signal line.

8. The semiconductor memory device according to claim 7, wherein said plurality of first bit lines are configured as bit line pairs, said second bit lines, said first signal line and said second signal lines are respectively configured as bit line signal input/output lines, a global word line and data input/ output lines.

9. A semiconductor memory device comprising:
    a memory array including,
    a plurality of word lines;
    a plurality of first bit lines respectively disposed so as to cross said plurality of word lines;
    a plurality of memory cells respectively disposed at points where said plurality of word lines and said plurality of first bit lines cross respectively;
    a first signal line disposed on said memory array so as to cross said plurality of first bit lines;

second signal lines respectively disposed on said memory array so as to cross said plurality of first bit lines;

second bit lines disposed on said memory array generally normal to, and to cross said plurality of first bit lines and connected to corresponding first bit lines, each second bit line being disposed between said first signal line and a respective one of each second signal line on said memory array and having an end terminated at a portion where said second bit line is connected to the corresponding first bit line; and shield lines respectively disposed corresponding to extensions of said second bit lines in non-extending regions of said second bit lines.

10. The semiconductor memory device according to claim 9, wherein said plurality of first bit lines are configured as bit line pairs, said second bit lines, said first signal line and said second signal lines are respectively configured as bit line signal input/output lines, a global word line and data input/output lines.

11. A semiconductor memory device comprising:
   a memory array including,
   a plurality of word lines;
   a plurality of first bit lines respectively disposed so as to cross said plurality of word line;
   a plurality of memory cells respectively disposed at points where said plurality of word lines and said plurality of first bit lines cross respectively;
   a first signal line disposed on said memory array so as to cross said plurality of first bit lines;
   second bit lines disposed on said memory array generally normal to, and to cross said plurality of first bit lines and connected to corresponding first bit lines, each second bit line having an end terminated at a portion where said second bit line is connected to the corresponding first bit line, and being disposed on said memory array so as to adjoin said first signal line;
   shield lines respectively disposed corresponding to extensions of said second bit lines in non-extending regions of said second bit lines; and
   second signal lines respectively crossing said plurality of first bit lines and disposed on said memory array so as to adjoin said second bit lines and said shielded lines.

12. The semiconductor memory device according to claim 11, wherein said plurality of first bit lines are configured as bit line pairs, said second bit lines, said first signal line and said second signal lines are respectively configured as bit line signal input/output lines, a global word line and data input/output lines.

13. A semiconductor memory device comprising: a plurality of memory arrays each including,
   a plurality of word lines;
   a plurality of first bit lines respectively disposed so as to cross said plurality of word lines;
   a plurality of memory cells respectively disposed at points where said plurality of word lines and said plurality of first bit lines cross respectively;
   second bit lines respectively disposed on each memory array generally normal to, and to cross said plurality of first bit lines and connected to corresponding first bit lines;
   first signal lines disposed on said each memory array so as to cross said plurality of first bit lines;
   second signal lines respectively disposed on said each memory array so as to cross said plurality of first bit lines, said second signal lines being longer than said second bit lines;
   a plurality of bit line load circuits for respectively supplying a predetermined potential to said plurality of first bit lines;
   a plurality of signal line load circuits for respectively supplying a predetermined potential to said second signal lines; and
   a plurality of transfer gates for respectively connecting or disconnecting said second bit lines and said second signal lines;
   wherein each bit line load circuit is reduced in charging capacity upon conduction of said each transfer gate and the non-selected first bit lines are maintained at the predetermined potential by corresponding signal line load circuits.

14. A semiconductor memory device comprising: a plurality of memory arrays each including,
   a plurality of word lines;
   a plurality of first bit lines respectively disposed so as to cross said plurality of word lines;
   a plurality of memory cells respectively disposed at points where said plurality of word lines and said plurality of first bit lines cross respectively;
   second bit lines disposed on said each memory array generally normal to, and to cross said plurality of first bit lines and connected to corresponding first bit lines;
   first signal lines disposed on said each memory array so as to cross said plurality of first bit lines;
   a plurality of second signal line pairs respectively disposed on said memory array so as to cross said plurality of first bit lines, each second signal line being longer than said second bit lines;
   a plurality of bit line load circuits for respectively controlling electrical connection between pairs of said first bit lines and a source potential;
   a plurality of transfer gates for respectively controlling electrical connection between pairs of said second bit lines and said plurality of second signal line pairs associated with the pairs of said second bit lines; and
   a plurality of signal line load circuits for respectively controlling electrical connection between said second signal line pairs and the source potential;
   wherein in a memory array block selected in response to a block selection signal, said bit line load circuits are brought into non-conduction and said transfer gates are brought into conduction.

15. A semiconductor device comprising:
   a plurality of memory blocks arranged along a first direction, each of the plurality of memory blocks including
      (a) a plurality of memory cells arranged in rows and columns,
      (b) a plurality of word lines provided corresponding to said rows of memory cells, each disposed along said first direction,
      (c) a plurality of first bit line pairs provided corresponding to said columns of memory cells, each disposed along a second direction, and
      (d) a plurality of second bit line pairs provided corresponding to said plurality of first bit line pairs, each disposed along said first direction and extending to a portion located at an end of said each of the plurality of memory blocks, each of said plurality of second bit line pairs directly connected to a corresponding one of said plurality of first bit line pairs;
   a data bus line pair provided in common to said plurality of memory blocks, and disposed on said plurality of memory blocks along said first direction; and a global word line provided in common to said plurality of memory blocks, and disposed between data bus lines included in said data bus line pair on said plurality of memory blocks along said first direction.

16. The semiconductor device according to claim 15, wherein
each line of said plurality of second bit line pairs is connected to a corresponding line of said plurality of first bit line pairs via a through hole.

17. The semiconductor device according to claim 15, further comprising
first and second shield lines, wherein
said data bus line pair is disposed between said first and second shield lines,
a first line included in one of said plurality of second bit line pairs is disposed between said first shield line and said global word line, and
a second line included in said one of said plurality of second bit line pairs is disposed between said second shield line and said global word line.

18. The semiconductor device according to claim 17, further comprising:
a third shield line disposed between said global word line and one of said data bus lines; and
a fourth shield line disposed between said global word line and the other of said data bus lines.

19. The semiconductor device according to claim 17, wherein
said data bus lines are adjacent to said global word line,
said first line is disposed between one of said data bus lines and said first shield line, and
said second line is disposed between the other of said data bus lines and said second shield line.

20. The semiconductor device according to claim 17, wherein
said first and second lines are adjacent to said global word line,
one of said data bus lines is disposed between said first line and said first shield line, and
the other of said data bus lines is disposed between said second line and said second shield line.

21. The semiconductor device according to claim 15, wherein
said global word line and said data bus line pair are disposed between one and another lines included in one of said plurality of second bit line pairs.

22. The semiconductor device according to claim 21, wherein
said one and other lines included in one of said plurality of second bit line pairs have one ends terminated at portions where said one and other lines are connected to corresponding first bit lines respectively.

23. The semiconductor device according to claim 15, wherein
one line included in one of said plurality of second bit line pairs is disposed between said global word line and one of said data bus lines, and
another line included in one of said plurality of second bit line pairs is disposed between said global word line and the other of said data bus lines.

24. The semiconductor device according to claim 23, wherein
said one and other lines included in one of said plurality of second bit line pairs have one ends terminated at portions where said one and other lines are connected to corresponding first bit lines respectively.

25. A semiconductor device comprising:
a plurality of memory blocks arranged along a first direction, each of the plurality of memory blocks including
(a) a plurality of memory cells arranged in rows and columns,
(b) a plurality of word lines provided corresponding to said rows of memory cells, each disposed along said first direction,
(c) a plurality of first bit line pairs provided corresponding to said columns of memory cells, each disposed along a second direction,
(d) a plurality of second bit line pairs provided corresponding to said plurality of first bit line pairs, each disposed along said first direction and extending to a portion located at an end of said each of the plurality of memory blocks, each of said plurality of second bit line pairs directly connected to a corresponding one of said plurality of first bit line pairs,
(e) a plurality of transfer circuits provided corresponding to said plurality of second bit line pairs respectively, each coupled between a corresponding one of said plurality of second bit line pairs and a pair of nodes, and each disposed in said portion located at the end of said each of the plurality of memory blocks, and
(f) a plurality of bit line load transistor pairs provided corresponding to said plurality of first bit line pairs, each coupled between a corresponding one of said plurality of first bit line pairs and a power supply, and responsive to a block selection signal;
a plurality of data bus line pairs each provided in common to said plurality of memory blocks, each connected to the pairs of nodes included in respective blocks of said plurality of memory blocks and disposed on said plurality of memory blocks along said first direction; and
a plurality of global word lines each provided in common to said plurality of memory blocks, and disposed on said plurality of memory blocks along said first direction.

26. The semiconductor memory device according to claim 25, further comprising
a plurality of data bus load circuits provided corresponding to said plurality of data bus line pairs respectively, and each coupled to a corresponding one of said plurality of data bus line pairs.

27. The semiconductor memory device according to claim 25, wherein
each of said plurality of bit line load transistor pairs is disposed on a first end portion of said each of the plurality of memory blocks,
said each of the plurality of memory blocks further includes another plurality of bit line load transistor pairs provided corresponding to said plurality of first bit line pairs and each coupled between a corresponding one of said plurality of first bit line pairs and a power supply, and
each of said other plurality of bit line load transistor pairs is disposed on a second end portion, opposite to said first end portion, of said each of the plurality of memory blocks.

* * * * *